US010811278B2

(12) United States Patent
Poo et al.

(10) Patent No.: US 10,811,278 B2
(45) Date of Patent: Oct. 20, 2020

(54) METHOD FOR PACKAGING CIRCUITS

(71) Applicant: Micron Technology, Inc., Boise, ID (US)

(72) Inventors: Chia Y. Poo, Singapore (SG); Low Siu Waf, Singapore (SG); Boon Suan Jeung, Singapore (SG); Eng M. Koon, Singapore (SG); Chua Swee Kwang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/435,200

(22) Filed: Jun. 7, 2019

(65) Prior Publication Data

US 2019/0362988 A1 Nov. 28, 2019

Related U.S. Application Data

(62) Division of application No. 15/339,290, filed on Oct. 31, 2016, now Pat. No. 10,453,704, which is a (Continued)

(30) Foreign Application Priority Data

May 6, 2003 (SG) .................................. 200302511

(51) Int. Cl.
*H05K 3/30* (2006.01)
*H01L 21/56* (2006.01)
(Continued)

(52) U.S. Cl.
CPC ............ *H01L 21/561* (2013.01); *H01L 21/56* (2013.01); *H01L 21/568* (2013.01);
(Continued)

(58) Field of Classification Search
CPC ... H01L 21/561; H01L 24/97; H01L 23/3114; H01L 21/568; H01L 24/05; H01L 21/56;
(Continued)

(56) References Cited

U.S. PATENT DOCUMENTS 3,617,938 A 11/1971 Denes et al.
3,691,707 A 9/1972 Von Arx et al.
(Continued)

FOREIGN PATENT DOCUMENTS

CA 2330426 11/1998
EP 689245 12/1995
(Continued)

OTHER PUBLICATIONS

"Singapore Application Serial No. 200302511-1, Search Report dated May 12, 2005", 17 pgs.

*Primary Examiner* — Donghai D Nguyen
(74) *Attorney, Agent, or Firm* — Schwegman Lundberg & Woessner, P.A.

(57) ABSTRACT

A method for packaging integrated circuit chips (die) is described that includes providing a base substrate with package level contacts, coating a base substrate with adhesive, placing dies on the adhesive, electrically connecting the die to the package level contacts, and removing the backside of the base substrate to expose the backside of the package level contacts. Accordingly, an essentially true chip scale package is formed. Multi-chip modules are formed by filling gaps between the chips with an encapsulant. In an embodiment, chips are interconnected by electrical connections between package level contacts in the base substrate. In an embodiment, substrates each having chips are adhered back-to-back with through vias formed in aligned saw streets to interconnect the back-to-back chip assembly.

13 Claims, 13 Drawing Sheets

Related U.S. Application Data division of application No. 14/053,233, filed on Oct. 14, 2013, now Pat. No. 9,484,225, which is a division of application No. 13/299,120, filed on Nov. 17, 2011, now Pat. No. 8,555,495, which is a division of application No. 12/705,923, filed on Feb. 15, 2010, now Pat. No. 8,065,792, which is a division of application No. 10/744,632, filed on Dec. 23, 2003, now Pat. No. 7,712,211.

(51) Int. Cl.

| | |
|---|---|
| ***H01L 21/683*** | (2006.01) |
| ***H01L 25/065*** | (2006.01) |
| ***H01L 25/00*** | (2006.01) |
| ***H01L 23/00*** | (2006.01) |
| ***H01L 21/66*** | (2006.01) |
| ***H01L 23/31*** | (2006.01) |

(52) U.S. Cl.

CPC .......... *H01L 21/6835* (2013.01); *H01L 22/00* (2013.01); *H01L 23/3114* (2013.01); *H01L 24/05* (2013.01); *H01L 24/97* (2013.01); *H01L 25/0657* (2013.01); *H01L 25/50* (2013.01); *H01L 2221/68345* (2013.01); *H01L 2224/97* (2013.01); *H01L 2225/06524* (2013.01); *H01L 2225/06541* (2013.01); *H01L 2225/06548* (2013.01); *H01L 2225/06551* (2013.01); *H01L 2225/06558* (2013.01); *H01L 2225/06575* (2013.01); *H01L 2924/12042* (2013.01); *H01L 2924/14* (2013.01); *Y10T 29/4913* (2015.01); *Y10T 29/49128* (2015.01); *Y10T 29/49144* (2015.01); *Y10T 29/49146* (2015.01); *Y10T 29/49155* (2015.01); *Y10T 29/49165* (2015.01); *Y10T 29/49167* (2015.01); *Y10T 29/49169* (2015.01); *Y10T 29/49794* (2015.01)

(58) Field of Classification Search

CPC . H01L 25/50; H01L 25/0657; H01L 21/6835; Y10T 29/49146; Y10T 29/49789; Y10T 29/49155; Y10T 29/4913

USPC .......................................... 29/832, 846, 852

See application file for complete search history.

(56) References Cited

U.S. PATENT DOCUMENTS 3,735,214 A 5/1973 Renskers et al.
3,991,296 A 11/1976 Kojima et al.
4,085,038 A 4/1978 Esseluhn
4,141,456 A 2/1979 Hart
4,355,457 A 10/1982 Barlett et al.
4,610,079 A 9/1986 Abe et al.
4,668,032 A 5/1987 Bouvier et al.
4,764,846 A 8/1988 Go
4,786,960 A 11/1988 Jeuch
4,790,894 A 12/1988 Homma et al.
4,811,722 A 3/1989 Brehm et al.
4,871,418 A 10/1989 Wittlinger et al.
4,896,459 A 1/1990 Brandt
4,900,893 A 2/1990 Yamazaki et al.
4,930,216 A 6/1990 Nelson
4,961,821 A 10/1990 Drake et al.
4,983,251 A 1/1991 Haisma et al.
5,079,222 A 1/1992 Yamazaki
5,081,049 A 1/1992 Green et al.
5,091,331 A 2/1992 Delgado et al.
5,107,586 A 4/1992 Eichelberger et al.
5,126,286 A 6/1992 Chance et al.
5,146,308 A 9/1992 Chance et al.
5,166,097 A 11/1992 Tanielian
5,185,295 A 2/1993 Goto et al.
5,200,362 A 4/1993 Lin et al.
5,218,229 A 6/1993 Farnworth
5,219,796 A 6/1993 Quinn et al.
5,272,114 A 12/1993 van Berkum, et al.
5,294,381 A 3/1994 Iguchi et al.
5,302,554 A 4/1994 Kashiwa et al.
5,302,849 A 4/1994 Cavasin
5,356,081 A 10/1994 Sellar
5,500,503 A 3/1996 Pernicka et al.
5,543,365 A 8/1996 Wills et al.
5,552,345 A 9/1996 Schrantz et al.
5,606,198 A 2/1997 Ono et al.
5,648,684 A 7/1997 Bertin et al.
5,656,553 A 8/1997 Leas et al.
5,661,901 A 9/1997 King
5,663,105 A 9/1997 Sua et al.
5,729,437 A 3/1998 Hashimoto
5,780,806 A 7/1998 Ferguson et al.
5,804,314 A 9/1998 Field et al.
5,825,076 A 10/1998 Kotvas et al.
5,844,317 A 12/1998 Bertolet et al.
5,846,375 A 12/1998 Gilchrist et al.
5,852,624 A 12/1998 Matsuyama et al.
5,856,937 A 1/1999 Chu et al.
5,879,964 A 3/1999 Paik et al.
5,888,884 A 3/1999 Wojnarowski
5,900,582 A 5/1999 Tomita et al.
5,902,499 A 5/1999 Richerzhagen
5,904,546 A 5/1999 Wood et al.
5,904,548 A 5/1999 Orcutt
5,910,687 A 6/1999 Chen et al.
5,925,934 A 7/1999 Lim
5,952,611 A 9/1999 Eng et al.
5,961,852 A 10/1999 Rafla-Yuan et al.
5,990,566 A 11/1999 Farnworth et al.
6,002,163 A 12/1999 Wojnarowski
6,004,188 A 12/1999 Roy
6,007,730 A 12/1999 Shiomi et al.
6,008,069 A 12/1999 Yamada
6,034,438 A 3/2000 Petersen
6,040,618 A 3/2000 Akram
6,054,760 A 4/2000 Tovar et al.
6,072,236 A 6/2000 Akram et al.
6,075,710 A 6/2000 Lau
6,083,218 A 7/2000 Chou
6,084,175 A 7/2000 Perry et al.
6,087,203 A 7/2000 Eng
6,096,635 A 8/2000 Mou et al.
6,117,704 A 9/2000 Yamaguchi et al.
6,130,401 A 10/2000 Yoo et al.
6,133,065 A 10/2000 Akram
6,137,164 A 10/2000 Yew et al.
6,156,030 A 12/2000 Neev
6,163,010 A 12/2000 Kobsa
6,204,186 B1 3/2001 Chaudhry et al.
6,211,488 B1 4/2001 Hoekstra et al.
6,211,572 B1 4/2001 Fjelstad et al.
6,214,703 B1 4/2001 Chen et al.
6,221,751 B1 4/2001 Chen et al.
6,228,687 B1 5/2001 Akram et al.
6,236,107 B1 5/2001 Chan et al.
6,257,224 B1 7/2001 Yoshino et al.
6,268,642 B1 7/2001 Hsuan et al.
6,271,060 B1 8/2001 Zandman et al.
6,291,317 B1 9/2001 Salatino et al.
6,291,894 B1 9/2001 Farnworth et al.
6,294,837 B1 9/2001 Akram et al.
6,295,978 B1 10/2001 Wark et al.
6,319,354 B1 11/2001 Farnworth et al.
6,326,689 B1 12/2001 Thomas
6,365,833 B1 4/2002 Eng et al.
6,379,999 B1 4/2002 Tanabe
6,383,835 B1 5/2002 Hata et al.
6,387,729 B2 5/2002 Eng et al.
6,393,685 B1 5/2002 Collins
6,414,374 B2 7/2002 Faraworth et al.
6,420,245 B1 7/2002 Manor

(56) References Cited

U.S. PATENT DOCUMENTS

| | | | |
|---|---|---|---|
| 6,427,676 | B2 | 8/2002 | Akram et al. |
| 6,451,627 | B1 | 9/2002 | Coffman |
| 6,462,399 | B1 | 10/2002 | Akram |
| 6,462,418 | B2 | 10/2002 | Sakamoto et al. |
| 6,521,995 | B1 | 2/2003 | Akram et al. |
| 6,534,382 | B1 | 3/2003 | Sakaguchi et al. |
| 6,548,891 | B2 * | 4/2003 | Mashino ............... H01L 21/486 257/666 |
| 6,555,294 | B1 | 4/2003 | Albertini et al. |
| 6,555,447 | B2 | 4/2003 | Weishauss et al. |
| 6,562,640 | B1 | 5/2003 | Tseng et al. |
| 6,562,698 | B2 | 5/2003 | Manor |
| 6,593,595 | B2 | 7/2003 | Ono et al. |
| 6,611,052 | B2 | 8/2003 | Poo et al. |
| 6,611,540 | B1 | 8/2003 | Mueller |
| 6,624,505 | B2 | 9/2003 | Badehi |
| 6,635,957 | B2 * | 10/2003 | Kwan ................ H01L 21/4832 257/691 |
| 6,656,765 | B1 | 12/2003 | DiCaprio |
| 6,669,801 | B2 | 12/2003 | Yoshimura et al. |
| 6,677,675 | B2 | 1/2004 | Bolken |
| 6,717,245 | B1 | 4/2004 | Kinsman et al. |
| 6,733,711 | B2 | 5/2004 | Durocher et al. |
| 6,734,370 | B2 | 5/2004 | Yamaguchi et al. |
| 6,735,231 | B2 | 5/2004 | Ono |
| 6,743,696 | B2 | 6/2004 | Jeung et al. |
| 6,750,547 | B2 | 6/2004 | Jeung et al. |
| 6,805,808 | B2 | 10/2004 | Fujii et al. |
| 6,836,009 | B2 | 12/2004 | Koon et al. |
| 6,894,386 | B2 | 5/2005 | Poo et al. |
| 6,930,382 | B2 | 8/2005 | Sawada et al. |
| 6,946,324 | B1 | 9/2005 | McLellan et al. |
| 7,071,018 | B2 | 7/2006 | Mason et al. |
| 7,198,969 | B1 | 4/2007 | Khandros et al. |
| 7,342,320 | B2 | 3/2008 | Hedler et al. |
| 7,358,154 | B2 | 4/2008 | Poo et al. |
| 7,375,009 | B2 | 5/2008 | Chua et al. |
| 7,675,169 | B2 | 3/2010 | Poo et al. |
| 7,712,211 | B2 | 5/2010 | Chia et al. |
| 7,820,484 | B2 | 10/2010 | Chua et al. |
| 8,065,792 | B2 | 11/2011 | Chia et al. |
| 8,106,488 | B2 | 1/2012 | Chua et al. |
| 8,555,495 | B2 | 10/2013 | Poo et al. |
| 8,564,106 | B2 | 10/2013 | Kwang |
| 9,484,225 | B2 | 11/2016 | Poo et al. |
| 2001/0000631 | A1 | 5/2001 | Zandman et al. |
| 2001/0021541 | A1 | 9/2001 | Akram et al. |
| 2001/0030357 | A1 | 10/2001 | Murata |
| 2001/0034564 | A1 | 10/2001 | Jones |
| 2001/0040152 | A1 | 11/2001 | Higashi et al. |
| 2001/0054606 | A1 | 12/2001 | Weishauss et al. |
| 2002/0001882 | A1 | 1/2002 | Eng et al. |
| 2002/0019069 | A1 | 2/2002 | Wada |
| 2002/0030245 | A1 | 3/2002 | Hanaoka et al. |
| 2002/0031864 | A1 | 3/2002 | Ball |
| 2002/0031899 | A1 | 3/2002 | Manor |
| 2002/0046997 | A1 | 4/2002 | Nam et al. |
| 2002/0086137 | A1 | 7/2002 | Brouillette et al. |
| 2002/0089043 | A1 | 7/2002 | Park et al. |
| 2002/0094607 | A1 | 7/2002 | Gebauer et al. |
| 2002/0123213 | A1 | 9/2002 | Williams |
| 2002/0139577 | A1 | 10/2002 | Miller |
| 2002/0164838 | A1 | 11/2002 | Moon et al. |
| 2002/0170896 | A1 | 11/2002 | Choo et al. |
| 2002/0190435 | A1 | 12/2002 | O'Brien et al. |
| 2003/0006795 | A1 | 1/2003 | Asayama et al. |
| 2003/0052098 | A1 | 3/2003 | Kim et al. |
| 2003/0060034 | A1 | 3/2003 | Beyne et al. |
| 2003/0071335 | A1 | 4/2003 | Jeung et al. |
| 2003/0071341 | A1 | 4/2003 | Jeung et al. |
| 2003/0082845 | A1 | 5/2003 | Hoffman et al. |
| 2003/0127428 | A1 | 7/2003 | Fujii et al. |
| 2004/0026382 | A1 | 2/2004 | Richerzhagen |
| 2004/0056008 | A1 | 3/2004 | Choo et al. |
| 2004/0188400 | A1 | 9/2004 | Peng et al. |
| 2005/0029668 | A1 | 2/2005 | Poo et al. |
| 2006/0084240 | A1 | 4/2006 | Poo et al. |
| 2008/0054423 | A1 | 3/2008 | Poo et al. |
| 2008/0211113 | A1 | 9/2008 | Chua et al. |
| 2010/0146780 | A1 | 6/2010 | Chia et al. |
| 2011/0018143 | A1 | 1/2011 | Chua et al. |
| 2012/0064697 | A1 | 3/2012 | Chia et al. |
| 2012/0119263 | A1 | 5/2012 | Chua et al. |
| 2014/0045280 | A1 | 2/2014 | Poo et al. |
| 2017/0047231 | A1 | 2/2017 | Poo et al. |

FOREIGN PATENT DOCUMENTS

| | | | |
|---|---|---|---|
| EP | 0689245 | A2 | 12/1995 |
| EP | 0802416 | A2 | 10/1997 |
| EP | 0818818 | | 1/1998 |
| EP | 1071126 | A2 | 1/2001 |
| EP | 1073099 | A2 | 1/2001 |
| JP | 58-036939 | | 3/1983 |
| JP | 59-097545 | | 6/1984 |
| JP | 60127743 | A2 | 7/1985 |
| JP | 61064176 | | 4/1986 |
| JP | 62224515 | A2 | 10/1987 |
| JP | 36-2046544 | | 2/1990 |
| JP | 2001-026435 | | 1/2001 |
| JP | 2002-170904 | | 6/2002 |
| SG | 142115 | | 5/2008 |
| WO | WO-9956907 | A1 | 11/1999 |
| WO | WO-0075983 | A1 | 12/2000 |
| WO | WO-0075985 | A1 | 12/2000 |
| WO | WO-0175966 | A1 | 10/2001 |

* cited by examiner 2300
2370
2372
2374
2376
2376
2376
2100
2100
2100
2101

METHOD FOR PACKAGING CIRCUITS

This application is a divisional of U.S. application Ser. No. 15/339,290, filed Oct. 31, 2016, which is a divisional of U.S. application Ser. No. 14/053,233, filed Oct. 14, 2013, now issued as U.S. Pat. No. 9,484,225, which is a divisional of U.S. application Ser. No. 13/299,120, filed Nov. 17, 2011, now issued as U.S. Pat. No. 8,555,495, which is a divisional of U.S. application Ser. No. 12/705,923, filed Feb. 15, 2010, now issued as U.S. Pat. No. 8,065,792, which is a divisional of U.S. application Ser. No. 10/744,632, filed Dec. 23, 2003, now issued as U.S. Pat. No. 7,712,211, which claims priority under Title 35, USC 119, to Singapore Application No. 200302511-1, filed May 6, 2003, all of which are incorporated in their entirety herein by reference.

TECHNICAL

The present invention relates generally to circuit packaging, and in particular to apparatus and methods for packaging integrated circuits.

BACKGROUND

Wafers are fabricated with a plurality of dies each having a plurality of integrated circuit elements therein. A die represents one individual chip that must be separated from adjacent dies before packaging. Contacts are added to the die before packaging. One type of contact is a bond pad. Wafer level packaging (WLP) refers to the integrated circuit packaging formed at the wafer level, usually at the wafer foundry. WLP is normally considered as a true chip size package. WLP thus provides lower cost and smallest size of commercial packaging. It is desired to reduce the profile and/or thickness of packaged components using a commercially viable process.

For the reasons stated above, for other reasons stated below, and for other reasons which will become apparent to those skilled in the art upon reading and understanding the present specification, there is a need in the art for an improved electronic component package and methods of packaging electronic components.

SUMMARY

The present invention is directed to forming a wafer-scale, integrated circuit package. That is, the present invention is directed to chip-scale packages An embodiment of the present invention includes fixing a die on a substrate, forming electrical connections from die to terminals on the substrate, and removing a backside of substrate to expose the terminals. In an embodiment, removing the backside of the substrate includes backgrinding the substrate to expose a backside of the terminals. In an embodiment, fixing the die to the substrate includes applying an adhesive to the top surface of the substrate and placing the die on the adhesive. The adhesive is cured to fix the die to the substrate. In an embodiment, the die is placed vertically over the terminals for that die. The electrical connections are formed from the die through the adhesive layer to the terminals. In an embodiment, the terminals are conductive pads formed on the top surface of the substrate. In an embodiment, the electrical connections are metal traces from the die to the conductive pads. In an embodiment, the adhesive layer is removed from around the periphery of the die to expose the terminals. In an embodiment, terminals on the substrate are interconnected to provide greater functionality of chip-scale package. In an embodiment, the die is singulated from adjacent die with a portion of the substrate remaining with the die. The singulated die package forms individual chip scale packages that include at least one active device and a portion of the second substrate.

An embodiment of the present invention further provides the ability to expand the functionality of the present invention to a multi-chip module. Dice are fixed to a substrate, for example, as described above and further described below. The gaps between the die are filled with an insulator. In an embodiment, the insulator is a rigid material, when cured, to assist in the mechanical strength of the multi-chip module. In an embodiment, terminals in the substrate are electrically connected to provide inter-chip electrical communication. This expands the functionality of them multi-chip module. In an embodiment, the dice in the multi-chip module each include an integrated circuit memory. In an embodiment, a first die includes an integrated circuit memory and a second die includes an integrated circuit. In an embodiment, the second die includes a processor. In an embodiment, the second die includes logic circuits.

An embodiment of the present invention includes fixing an act substrate that has a plurality of dice to a base substrate. Electrical communication lines are formed between the die and respective package level terminals or pads on the base substrate. The backside of the base substrate remote from the active device substrate is removed to expose the package level terminals. The dice are separated with its respective portion of the base substrate, which at least partially includes package level terminals. In an embodiment, a top surface of the base substrate is coated with an adhesive. In an embodiment, the removing the backside of the base substrate includes back grinding the base substrate. In an embodiment, separating the dice includes singulation, for example by laser. In an embodiment, forming electrical connections includes forming a conductive trace from a top bond pad of a die along the side of the die to contact a package level terminal. In an embodiment, the conductive trace is formed by a metal redistribution process.

An embodiment of the present invention is directed to a chip-scale-packaging method including fixing two substrates together and forming electrical contacts between active devices on the two substrates. In an embodiment, the two substrates each include a plurality of dice that contain the active integrated circuits. The dice are singulated to form discrete packages with contacts on each die and along the sides of the package. In an embodiment, fixing the two substrates together includes coating the top surface of the second substrate with an adhesive and curing the adhesive to fix the second substrate on the first substrate. In an embodiment, the first substrate is placed on the adhesive layer such that the saw streets of the first substrate align with the saw streets of the second substrate. In an embodiment, a plurality of through apertures are formed in the aligned first and second saw streets. The electrical connections from the first dice on the first substrate are formed through the through apertures to the second dice on the second substrate. In an embodiment, forming electrical connections from the first dice on the first substrate to the second dice on the second substrate includes routing a conductive trace from a first bond pad on an active device surface of the first substrate to a second bond pad on an active device surface of the second substrate through the through aperture. In an embodiment, singulating dice includes mechanically cutting the saw streets. In an embodiment, singulating dice includes lazing the saw streets. In an embodiment, cutting the saw streets includes partially cutting the electrical connection in the through apertures such that a portion of the electrical connection in a specific through aperture remains with each of the dice adjacent the through aperture. In an embodiment, forming electrical connections includes forming metal traces including at least one metal from a group consisting essentially of copper and aluminum. In an embodiment, forming through apertures and/or cutting the saw streets include cutting a kerf in at least one of the saw streets Embodiments of the present invention further include connecting the chip-scale package to a further substrate such as a circuit board. The chip-scale-package of an embodiment of the present invention includes contacts at the top of the die, along the side of the die and at the terminals formed in the substrate.

The present invention also includes substrates, wafers, integrated circuit packages, electrical devices, memory devices, memory units, memory modules, electrical systems, computers, which include a chip-scale-package according to the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

The present description uses the relative terms Atop@ and Aback@ when referring to the substrate on which integrated circuits are formed. The term Atop@ herein refers to the surface on which the layers that form an active integrated circuit structure are fabricated. The term Aback@ herein refers to the region of the substrate beneath the surface on which active circuit structures are fabricated.

Figure 1:
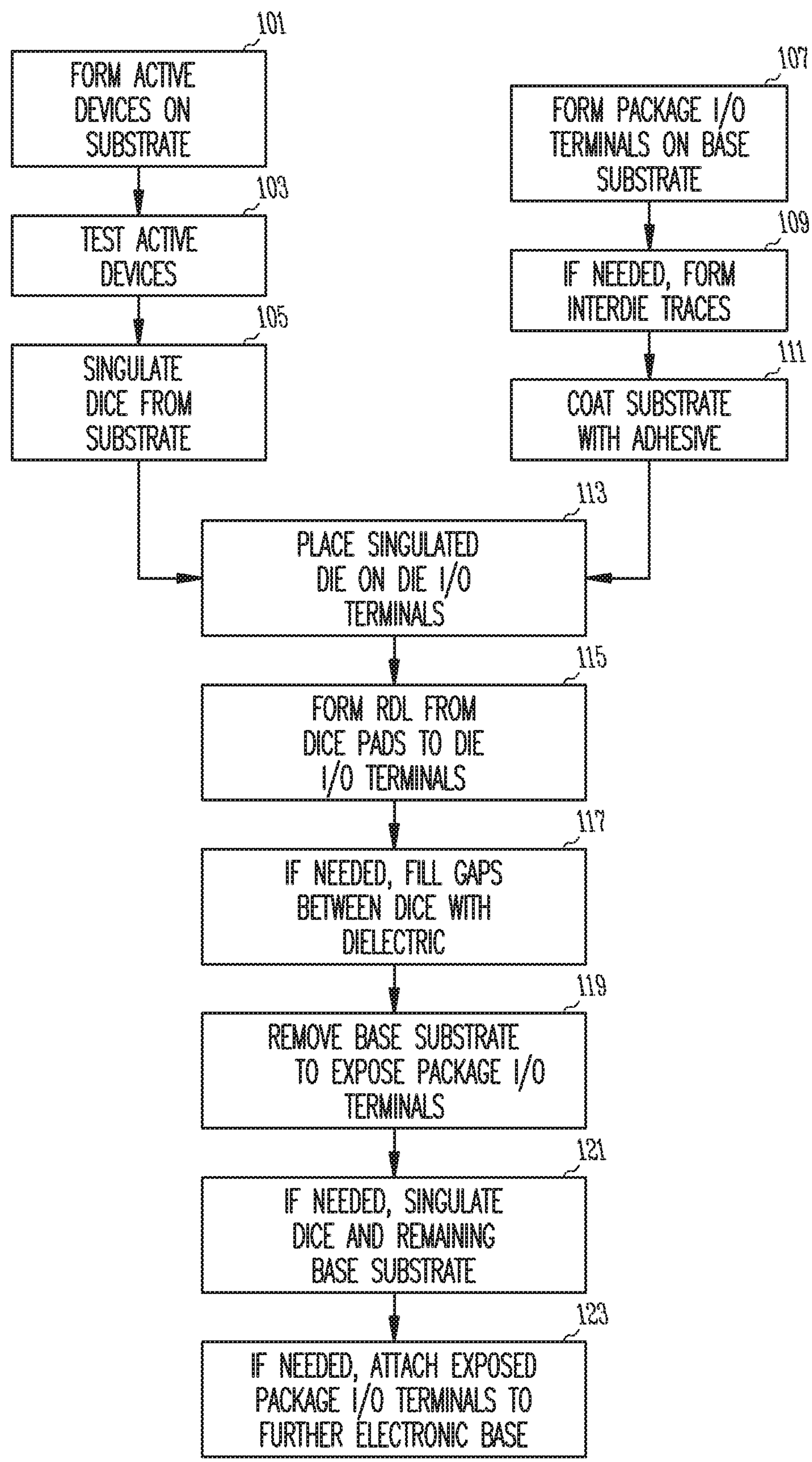
FIG. 1 is a flow chart of a method according to an embodiment of the present invention.

FIG. 1 shows a flowchart of a method for packaging according to an embodiment of the present invention. The method is generally directed to wafer level packaging that achieves a chip scale package. A plurality of dies are formed on a top surface of a substrate, 101. One type of a substrate is a wafer. The wafer is crystalline silicon in an embodiment. Each die includes an active integrated circuit such as a memory device, processor, logic circuits, or application specific integrated circuits. Memory devices include read only memory, dynamic random access memory, static random access memory, EEPROM, and flash memory. Additionally, the memory device could be a synchronous memory device such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies as known in the art. Such active devices are tested to identify and remove faulty active devices from further fabrication and to identify possible error-inducing fabrication processes, 103. The dice are singulated from each other, 105. In an embodiment, the testing occurs at the wafer level prior to singulation. The dice identified as good dice are selected and ready for further fabrication and/or packaging.

A base substrate is formed separately from the active die substrate. The base substrate is adapted to provide electrical communication terminals for the active dice in a wafer level package. The base substrate is composed of a non-conductive material. In an embodiment, the base substrate is crystalline silicon. In an embodiment, the base substrate is a wafer. Package level terminals are formed on a top surface of the base substrate, 107. Such package level terminals are patterned, discrete conductive pads. In an embodiment, the package level terminals are formed of a metal. In an embodiment, the metal is copper. In an embodiment, the metal is aluminum. If electrical communication is required between the package level terminals, then conductive lines or traces are formed on the base substrate between the package level terminals, 109.

The top surface of the base substrate is coated with an adhesive, 111. In an embodiment, the adhesive is spin coated on the base substrate top surface. In an embodiment, the adhesive is pattern coated on the base substrate top surface. Examples of patterning the adhesive include screen printing and jet printing. The adhesive includes a polymide (PI) in an embodiment. The adhesive includes a benzocyclobutene (BCB) in an embodiment.

The singulated dice are picked and placed on the adhesive layer generally over the package level terminals, 113. The adhesive is cured to fix the dice to the base substrate. In an embodiment with the adhesive covering the package level terminals, the adhesive is removed from over at least a portion of the package level terminals. That is, the package level terminals extend outwardly from the footprint of the die. Thus, the adhesive that is not beneath the die is at least partially removed to expose a portion of the terminal.

Conductive lines are formed from the input/output pads of the dice to the package level terminals, 115. The die input/output pads are on the top surface. The conductive lines extend outwardly from the die input/output pads and down the side of the die through the adhesive layer to physically and electrically contact the package level terminals. In an embodiment, the conductive lines include castellation lines. In an embodiment, the conductive lines are formed by a redistribution layer process. The redistribution layer process includes blanket depositing a metal redistribution layer on the die and on at least the package level terminals of the base substrate. Next, a radiant sensitive film, such as a wet film resist, or a dry film resist, is blanket deposited on the redistribution layer. The radiant sensitive film is then exposed to a radiant source, e.g., a light source or laser, to the pattern of conductor lines. Development of the exposed radiant sensitive film forms a mask that can be used to etch the pattern of conductor lines. Such an etching process is known in the art as a "subtractive" process. An Aadditive@ process could also be used where the mask is patterned and then the conductor for the redistribution layer is deposited in the spaces in the mask. The mask and any conductive material on the mask is then removed. In an embodiment, the conductive material for the conductive lines is a metal. In an embodiment, the metal includes copper. In an embodiment, the metal includes aluminum.

In an embodiment of the present invention, a plurality of the die remain joined on the base substrate to form a multi-chip module. Such a multi-chip module increases the functionality of the individual die. For example, different types of integrated circuits are in different die in the multi-chip module such as logic circuits or processors and memory devices. The gaps between the die on the base substrate are filled with a non-conductive material, 117. This increases the mechanical strength of the multi-chip module.

The backside of the package level terminals remain covered by the backside of the base substrate. The backside of the base substrate is removed, 119, to expose the back of the package level terminals, which are connected to a die input/output pad through the conductive lines. In an embodiment, either a wet or dry etching process can be used to etch the backside of the substrate to form a thinned substrate. For thinning by wet etching, an etchant solution containing a mixture of KOH (Potassium Hydroxide) and $H_2O$ can be utilized. A one to one solution at a temperature of about 60 degrees to 80 degrees C. will etch monocrystalline silicon at an etch rate of about 300 to 800 angstroms/min. Another wet etching process can be performed using an isotropic etch of $HNO_3$ and HF producing an etch rate of 55-60 Φm/min. A dry etch process with an etchant such as a species of chlorine can also be utilized. In this case, the etch rate will be much slower than specified above. Alternately, thinning can be performed using chemical mechanical polishing (CMP). CMP includes a mechanical pad and a silica based slurry composition to back polish or back grind the substrate without chemical etching. The back surface of the package level terminals are now exposed.

A very thin sliver of the base substrate remains connecting the package level terminals to each other. This remaining base substrate sliver is cut to singulate the wafer level packages, 121, which include a die and a portion of the base substrate and portions of the package level terminals. Each packaged die is singulated from the other packaged dies in an embodiment. In an embodiment, a plurality of die remain together to form a multi-chip module that is singulated from other die and/or other multi-chip modules.

In an embodiment, the singulated die or singulated multi-chip modules are attached to a further electronic base, 123. One type of electronic base is a circuit board such as a PCB. The exposed package level terminals are electrically connected to conductors, such as land patterns, on the further electronic base. In an embodiment, the singulated die or multi-chip module are fixed to a further electronic base using surface mount technology.

Figure 2:
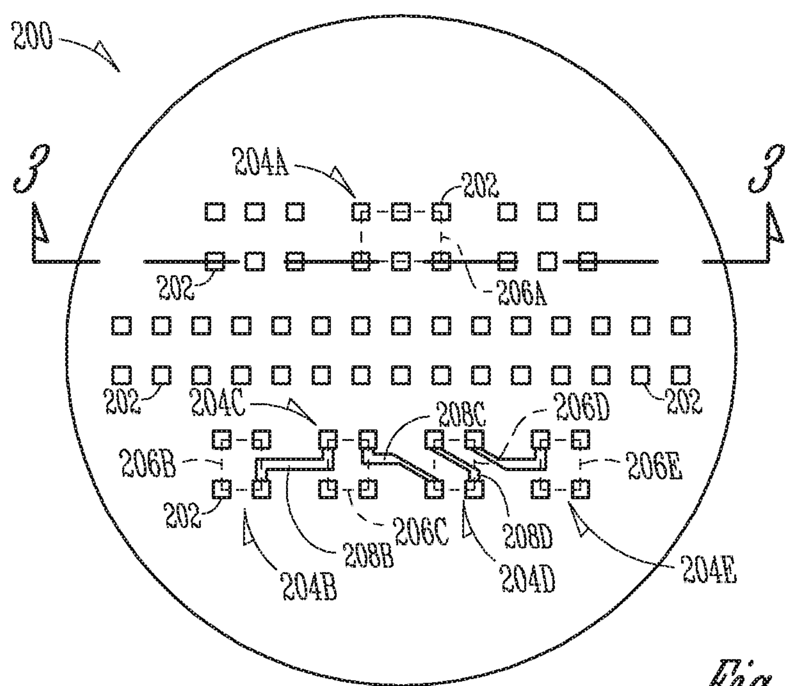
FIG. 2 is a plan view of a substrate during a method step according to the teachings of the present invention.

FIG. 2 shows a plan view of an active device substrate 200. As shown the substrate 200 is a wafer, however, the present invention is not limited to only a wafer. A plurality of input/output or bond pads 202 are on the top surface of the individual die that include active devices and are formed on the substrate 200. FIG. 2 shows a schematic representation of the position of pads 202 to better illustrate the present invention. It will be recognized that the bond pads 202 are typically much smaller and greater in number with respect to the substrate 200. An array of bond pads 204 define an attachment location 206 for a die. The bond pad array 204 provides the external, backside connections for an attached die. Conductive traces 208 are formed in the substrate 200 between certain bond pads 202 in an embodiment. The traces 208 provide electrical communication lines between bond pad arrays, e.g., trace 208B connecting a pad in array 204B to a pad in array 204C, trace 208C connecting a pad in array 204C to a pad in array 204D, and trace 208E connecting a pad in array 204D to a pad in array 204E. The traces 208 can also connect pads with an array, e.g., trace 208D connecting two pads together in array 204D.

Figure 3:
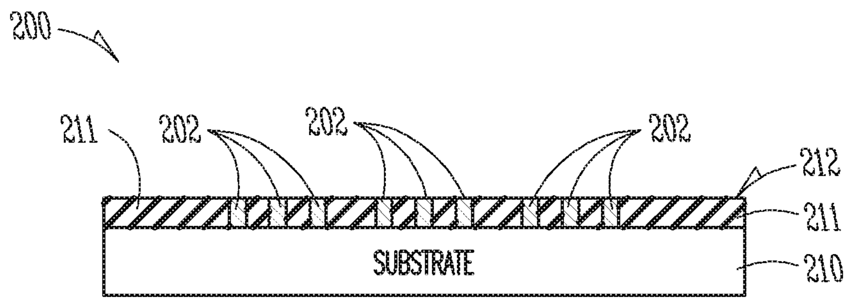
FIG. 3 is a cross-sectional taken generally along line 3-3 of FIG. 2.

FIG. 3 shows a cross sectional view of substrate 200 taken generally along line 3-3 of FIG. 2. A base layer 210 is provided. In an embodiment, the base layer is a bare wafer. In an embodiment, the base layer is formed of monocrystalline silicon. A plurality of conductive bond pads 202 are formed on the top surface of the substrate 210. In an embodiment, the bond pads 202 include metal. In an embodiment, the bond pads are aluminum. In an embodiment, the bond pads are copper. The bond pads 202 are separated by insulative material 211. In an embodiment, the insulative material is silicon dioxide. The top surface 212 of substrate 200 is essentially planar. In an embodiment, the top surface 212 is planarized after the bond pads 202 are formed. Planarizing the top surface 212 may include chemical-mechanical polishing.

Figure 4:
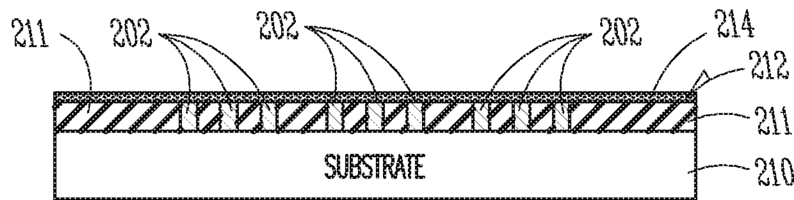
FIG. 4 is a further cross-sectional view after s further method step according to the teachings of the present invention.

FIG. 4 shows a cross sectional view of substrate 200 after a further process step of the present invention. An adhesive layer 214 is deposited on the surface 212. The adhesive layer 214 is spin coated on substrate 200. The adhesive layer 214 covers the entire surface 212. In an embodiment, the adhesive layer includes a polymide. In an embodiment, the adhesive layer includes benzocyclobutene (BCB). In an embodiment, the adhesive layer 214 is patterned such that it covers at least the attachment locations 206 for the die. The adhesive layer 214 could be patterned by printing techniques.

Figure 5:
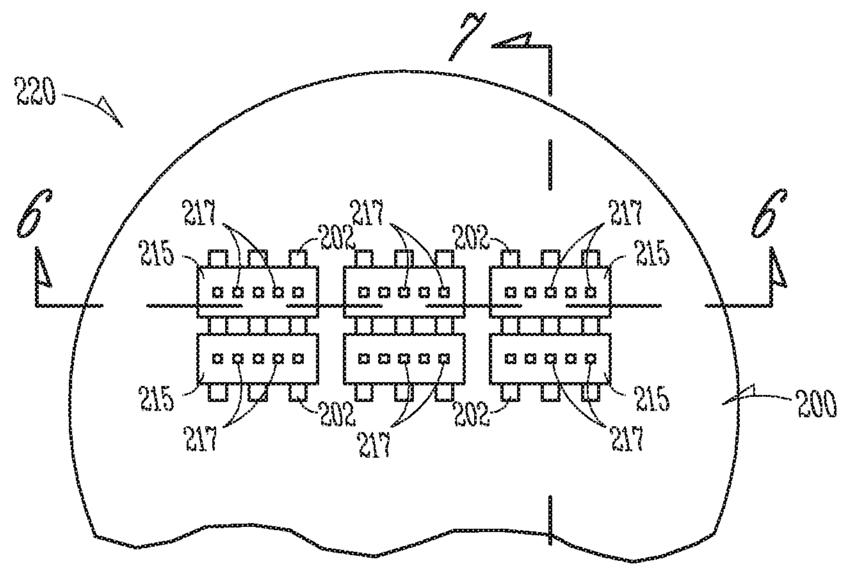
FIG. 5 a plan view of a substrate during a method step according to the teachings of the present invention.

FIG. 5 shows a fragmentary plan view of substrate 200 after a further process step. A plurality of die 215, which include active devices such as integrated circuits, are fixed to the attachment locations 206 by adhesive layer 214 to form a dice/substrate assembly 220. Each die 215 includes a plurality of die bond pads 217 on top of the die and in electrical communication with the active devices in the die. The die bond pads 217 provide electrical contacts for the active devices and electrical circuits outside the die.

Figure 6:
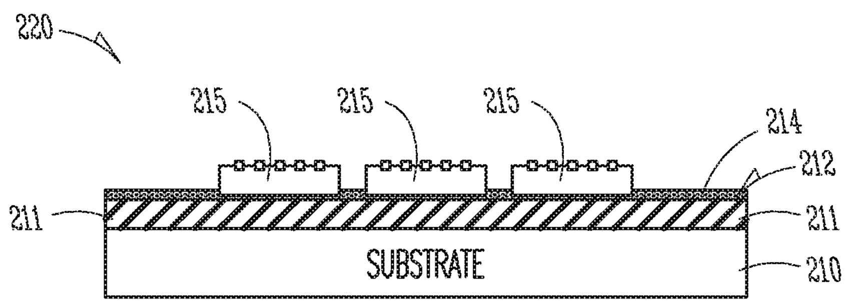
FIG. 6 is a cross-sectional view taken generally along line 6-6 of FIG. 5.
Figure 7:
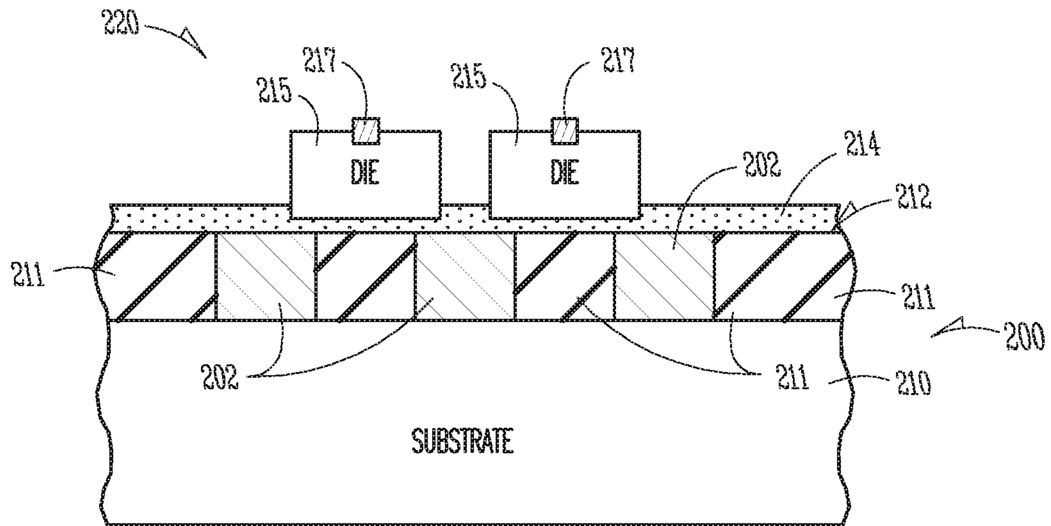
FIG. 7 is an enlarged cross-sectional view taken generally along line 7-7 of FIG. 5.
Figure 8:
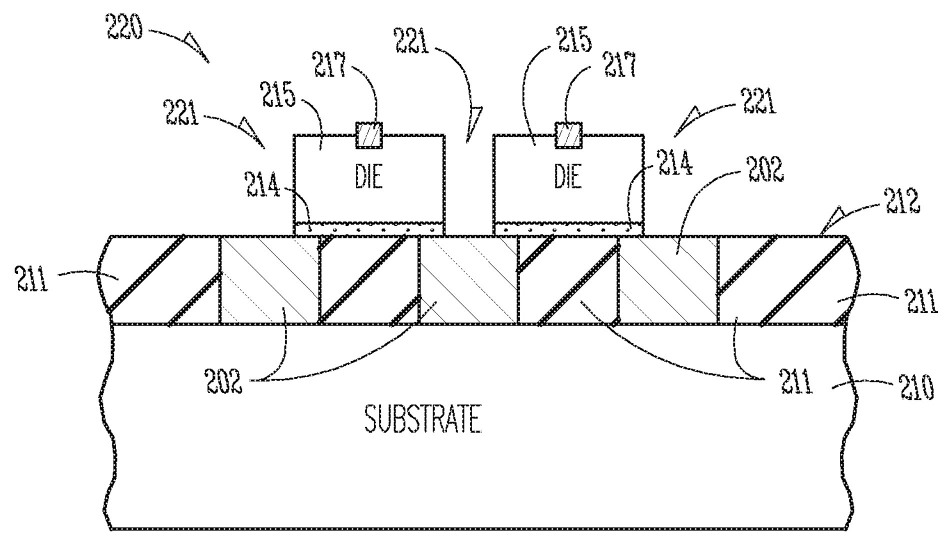
FIG. 8 is a cross-sectional view of during a method step according to the teachings of the present invention.
Figure 9:
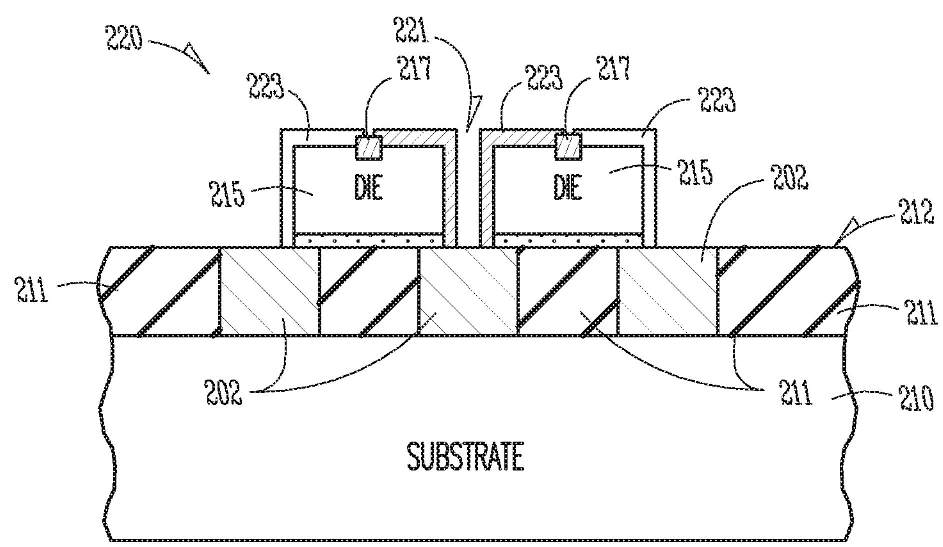
FIG. 9 is a cross-sectional view of during a method step according teachings of the present invention.
Figure 10:
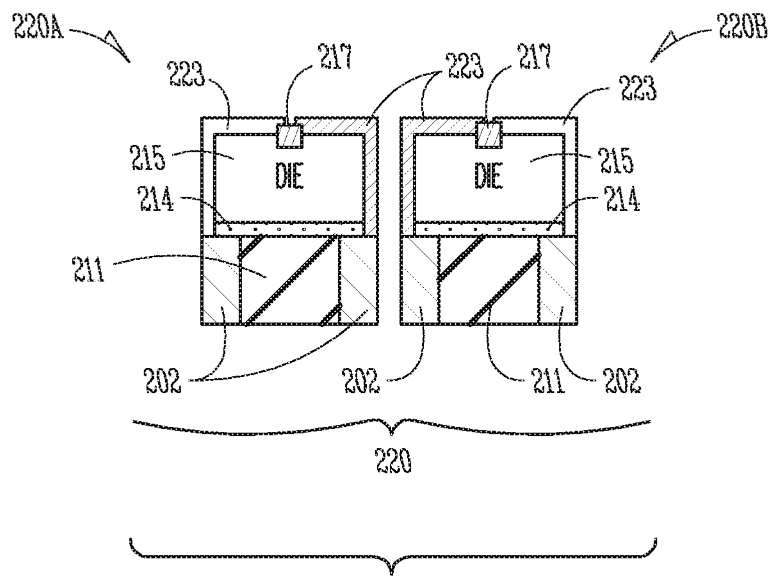
FIG. 10 is a cross-sectional view of during a method step according to the teachings of the present invention.

Referring now to FIGS. 6 and 7, FIG. 6 shows a cross sectional view taken generally along line 6-6 in FIG. 5. FIG. 7 shows a cross sectional view taken generally along line 7-7 of FIG. 5 and with an increased scale. FIGS. 6 and 7 show the assembly 220 of dice 215 with the base substrate 200. The dice 215 are pressed onto the adhesive layer 214. Adhesive layer 214 is cured to fix the dice 215 to the base substrate 200. FIG. 8 shows a view similar to FIG. 7 after a further process step of removing the adhesive layer 214 except the portion of adhesive layer fixing the dice 215 to substrate 200. The adhesive is selectively removed from on top of portions of wafer level terminals 202 to thereby create trenches 221 extending from the top of dice 215 to the top surface of terminals 202. FIG. 9 shows a view similar to FIG. 8 of assembly 220 after a further process step of forming a redistribution layer. The redistribution layer forms conductive lines 223 from the die pads 217 to the wafer level terminals 202. FIG. 10 shows a view similar to FIG. 9 of assembly 220 after a further process step of singulating the assembly 220 into wafer level packages 220A and 220B. This singulation step is accomplished by mechanically cutting through the insulative layer 211 and the wafer level terminals 202 that are intermediate the dice 215. In an embodiment, a saw blade is used to mechanically cut the die from each other. In an embodiment, a laser is used to mechanically cut the die from each other. In an embodiment, a laser/water jet is used mechanically cut the die from each other. An embodiment of the laser/water jet is described in U.S. patent application Ser. No. 10/118,666, titled AWAFER DICING DEVICE AND METHOD@ and having the same assignee as the present application, which application is incorporated herein by reference for any purpose. The singulated wafer level packages now have electrical contacts on the back surface, i.e., the wafer level terminals 202; on the top surface, i.e., the top portion of conductive line 223 and/or bond pad 217; and on the side surface, i.e., the conductive line 223. These singulated wafer level packages 220A and 220B could now be stacked on top of each other or contact other circuits on one, two or, three sides to improve the functionality of the active circuit within the wafer level package 220A, 220B.

Figure 11:
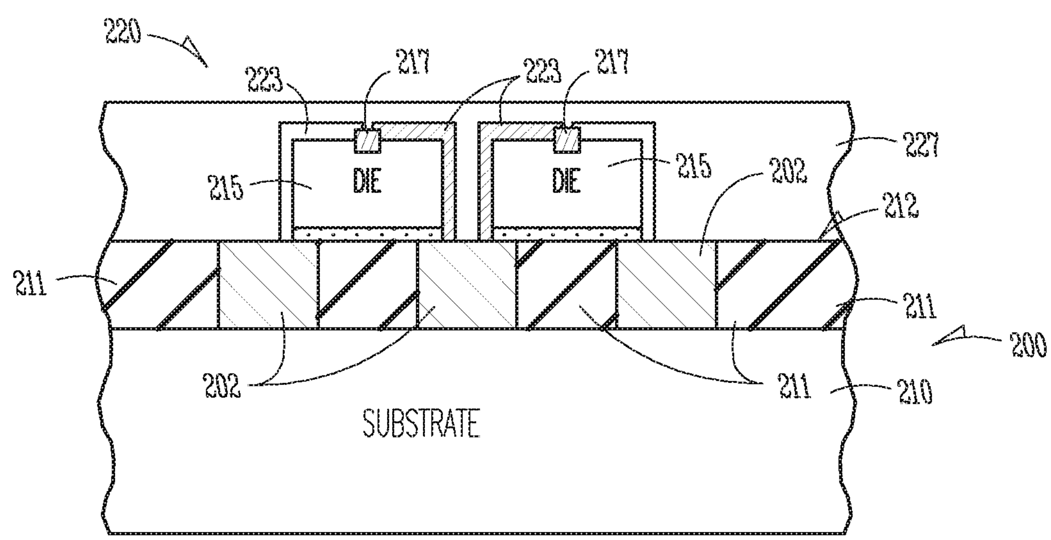
FIG. 11 is a cross-sectional view of during a method step according to a multi-chip package of the present invention.
Figure 12:
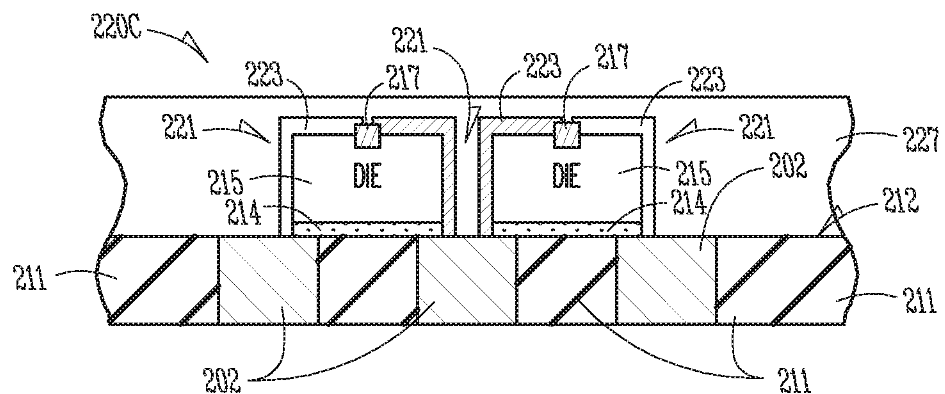
FIG. 12 is a cross-sectional view of during a method step according to the multi-chip package according to the teachings of the present invention.

FIG. 11 shows an alternate embodiment of the present ion. An assembly 220 is prepared as describe above through FIG. 9. After the conductive lines 223 are formed, the trenches 221 are filled with a non-conductive layer 227. Dice connected physically together by layer 227 remain together as a multi-chip module. In an embodiment, the trench filling material of layer 227 includes a polymide (PI). The trench filling material of layer 227 includes a benzocyclobutene (BCB) in an embodiment. After layer 227 is formed the backside of substrate 200 is removed (FIG. 12). A wafer level package 2200 is formed. It will be recognized that layer 227 covers the top portion of dice 215 in an embodiment. In an embodiment, layer 227 only fills the trenches 221 leaving the top of conductive lines 223 and bond pads 217 exposed and available to connect to external electrical circuits.

Figure 13:
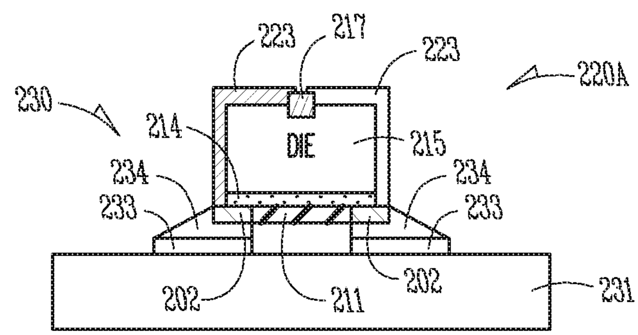
FIG. 13 is a cross-sectional view of an electrical system according to the teachings of the present invention.

FIG. 13 shows a final assembly 230 including a wafer level package 220A of the present invention. A wafer level package 220A is mounted to an electrical system substrate 231 using surface mount technology. In an embodiment, substrate 231 is a PCB. Electrical system substrate 231 includes a plurality of land contacts 233. The plurality of land contacts 233 are covered by a conductive solder 234. Wafer level terminals 202 of wafer level package 220A are placed on the solder 234. The solder 234 is cured to mechanically and electrically connect wafer level package 220A to substrate 231. While shown and described with a single die wafer level package 220A, the same assembly is used for a multi-chip module 220C which would require additional contacts.

Figure 14:
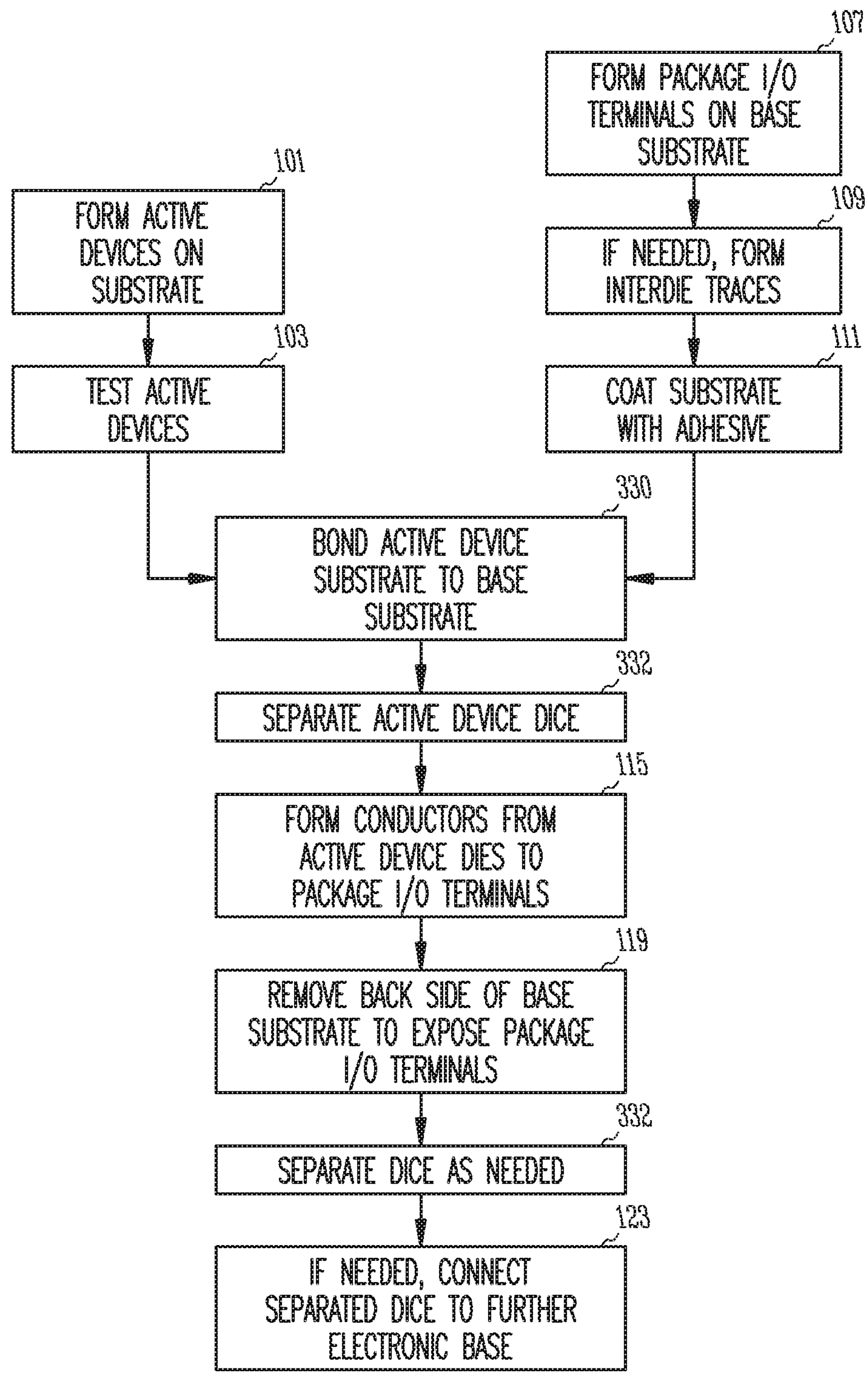
FIG. 14 is a flow chart of a method according to an embodiment of the present invention.
Figure 15:
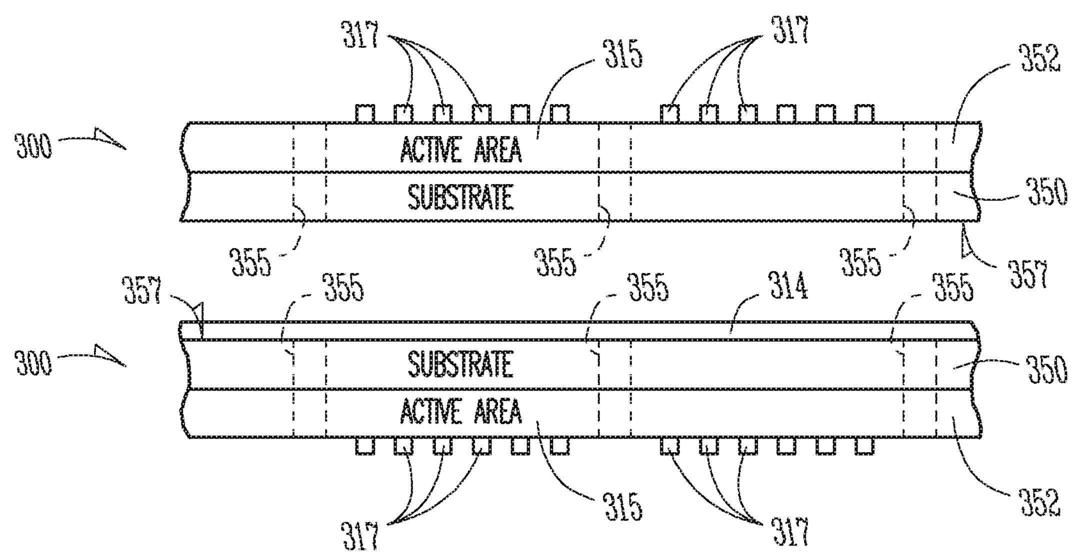
FIG. 15 is an elevational view of an embodiment of the present invention.
Figure 16:
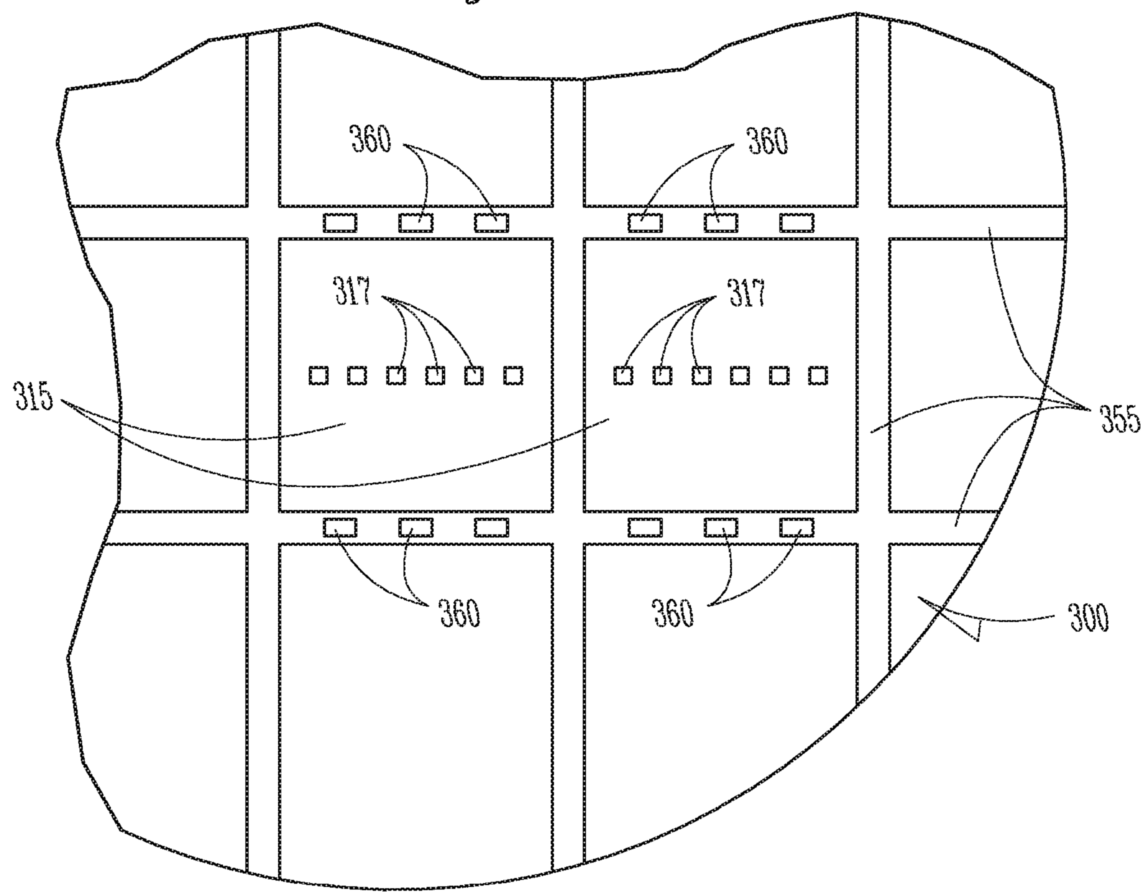
FIG. 16 is a fragmentary top view after a step according to an embodiment of the present invention.

FIG. 14 shows a flowchart of a method for packaging according to an embodiment of the present invention. Processes 101, 103, 107, 109 and 111 are the same as those described above with reference to FIG. 1. The active device die are not singulated in this embodiment prior to adhering the active device substrate to the base substrate. This embodiment includes bonding the active device substrate to the base substrate 330. An embodiment includes joining a wafer containing the active devices to a base wafer that includes the wafer level terminals and is coated with an adhesive layer. The adhesive is cured. The active device substrate is then cut to a depth at least equal to the height of the active device substrate, 332. An example of this type of partial cutting (creating kerfs) is described in U.S. patent application Ser. No. 10/232,226, titled AWAFER LEVEL PACKAGING@, filed Aug. 28, 2002, and incorporated by reference herein for any purpose. The active device dies are now separated by trenches. The adhesive that remains at the bottom of the trench on the base substrate and not under the die of the active device is removed to expose the wafer level terminals. Conductive lines are formed from the input/output pads of the dice to the package level terminals, 115. The die input/output pads are on the top surface. The conductive lines extend outwardly from the die input/output pads and down the side of the die through the adhesive layer to physically and electrically contact the package level terminals. In an embodiment, the conductive lines include castellation lines. In an embodiment, the conductive lines are formed by a redistribution layer process. The package level terminals remain covered by the backside of the base substrate. The backside of the base substrate is removed, 119, to expose the hack of the package level terminals, which are connected to a die input/output pad through the conductive lines. In an embodiment, either a wet or dry etching process can be used to etch the backside of the substrate to form a thinned substrate. Alternately, thinning can be performed using chemical mechanical polishing (CMP). CMP includes a mechanical pad and a silica based slurry composition to back polish or back grind the substrate without chemical etching. The back surface of the package level terminals are now exposed. Other mechanically grinding processes related to integrated circuit processes are within the scope of the present invention. The dice/base substrate is now singulated, 121. If needed the singulated dice with a portion of the base substrate is connected to a further electronic substrate, 123.

Figure 17:
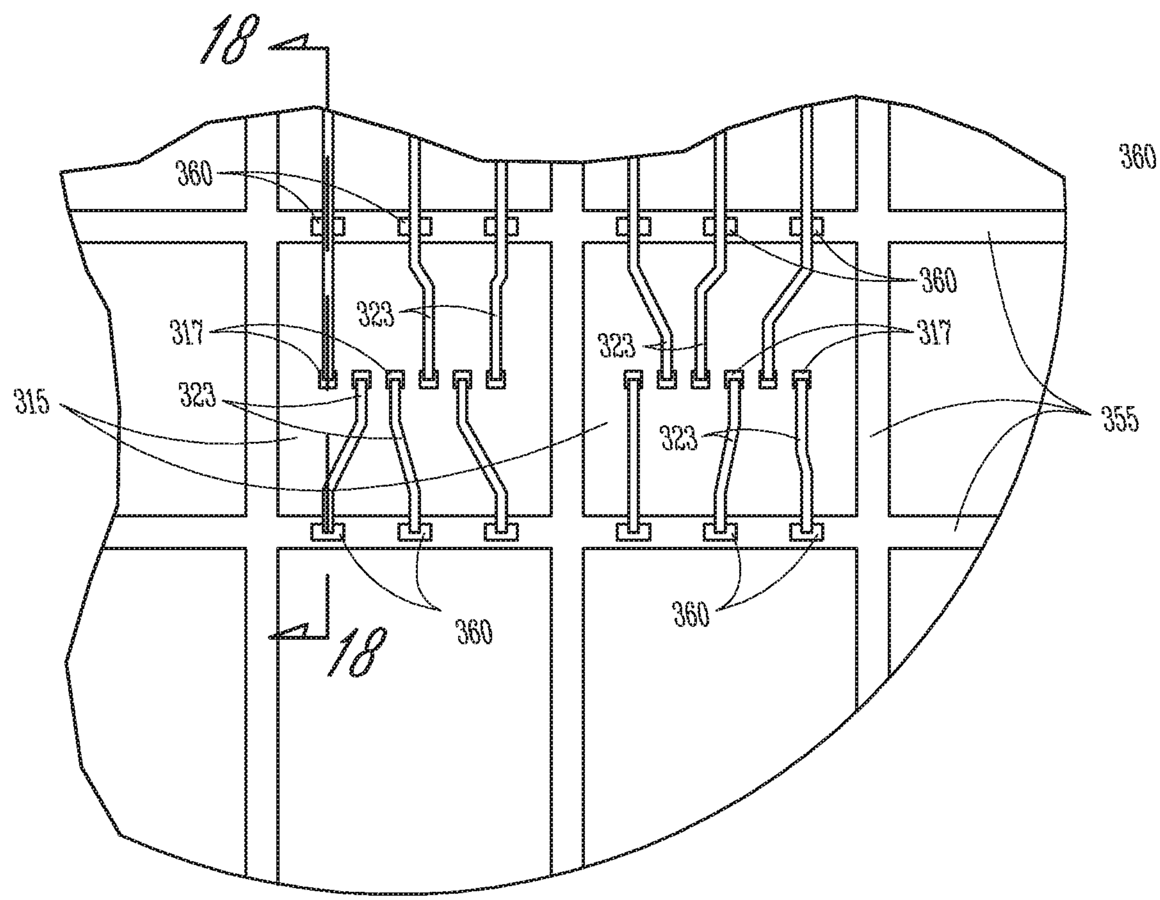
FIG. 17 is a fragmentary top view after a step according to an embodiment present invention.
Figure 18:
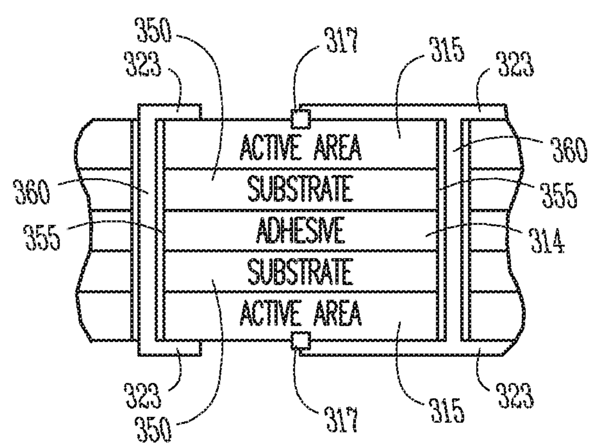
FIG. 18 is a cross-sectional view taken generally along line 18-18 of FIG. 17.
Figure 19:
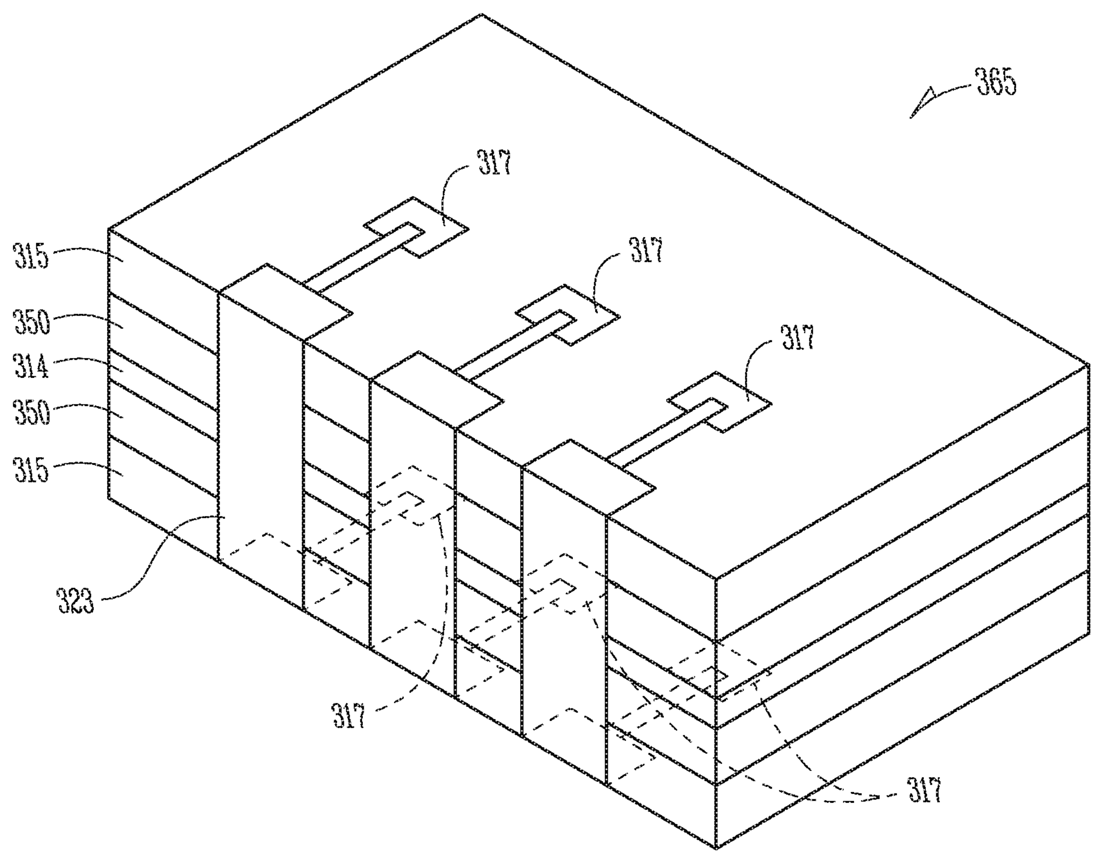
FIG. 19 is a schematic view of a die stack according to the embodiment shown in FIGS. 15-18.

FIGS. 15-19 show a further embodiment of the present invention. In this embodiment, two substrates 300 each having active devices formed on an respective, active side are joined together at the substrate level. In an embodiment, both substrates 300 are wafers and are joined together at the wafer level. Each substrate 300 includes a substrate base layer 350 on which is formed an active device layer 352. The substrate base layer 350 is monocrystalline silicon in an embodiment. The active areas 352 each include a plurality of die 315 that include the active circuits electrically connected to bond pads 317. Dice 315 are substantially similar to dice 215 described herein. Bond pads 317 are substantially similar to bond pads 217 described herein. The bond pads 317 are formed on the top of the dice 315 remote from the substrate base layer 350. Individual die are separated from each other by saw streets 355. The top and bottom substrates 300 are mirror images of each other so that corresponding die 315 in each of the top and bottom substrate 300 align with each other as well as the saw streets 355 aligning with each other. The saw streets 355 of the top substrate would lie directly above the saw streets 355 of the bottom substrate. In joining the top substrate to the bottom substrate, the bottom substrate is flipped so that its backside 357 faces upward. The backside 357 of the bottom substrate 300 is coated with an adhesive 314. Adhesive 314 is substantially similar to adhesive 214 described herein. Backside 357 of the top substrate is brought into contact with the adhesive 314. The adhesive is cured to fix the substrates together. The saw streets 355 are vertically aligned. A plurality of through vias or apertures 360 are formed in the saw streets through both the top substrate and the bottom substrate. Vias 360 are formed by lazing the saw streets to burn through the two substrates 300 and the adhesive layer 314. In an embodiment, the laser is adapted for cutting substrate structures fabricated according to known techniques. In an embodiment, the laser is a solid state laser. In an embodiment, the laser is a yttrium-aluminum-garnet (YAG) laser. In an embodiment, the laser is a neodymium-YAG laser. The laser wavelength, in an embodiment, is about 1 micrometer. In an embodiment, the laser power is about 300 watts. In an embodiment, the laser power is less than about 300 watts. In an embodiment, the laser power is greater than about 100 watts. In an embodiment, the laser refresh rate is about 3,000 Hz. In an embodiment, the laser refresh rate is less than about 3,000 Hz. In an embodiment, the laser refresh rate is greater than 1,000 Hz. In an embodiment, the laser is an excimer laser. The laser is desirable for use in scribing or cutting the workpiece (here, the stacked substrates 300) as the laser does not apply mechanical stress onto the workpiece. A plurality of conductive lines 323 are formed from the top die bond pads 317 to the edge of the die and through a respective via 360 to the bottom die bond pads 317 (FIGS. 17 and 18). The conductive lines 323 are formed by a redistribution layer process as described herein. Conductive lines 323 are substantially similar to conductive lines 232. Now the vertically aligned dice that are joined by the adhesive are electrically connected together through a conductive line 323. The individual joined die assembly 365 can now be singulated. Singulated die assembly 365 are schematically shown in FIG. 19 with the conductive line 323 remaining in part of via 360 after cutting the adjacent die assemblies apart during singulation.

Circuit Modules

Figure 20:
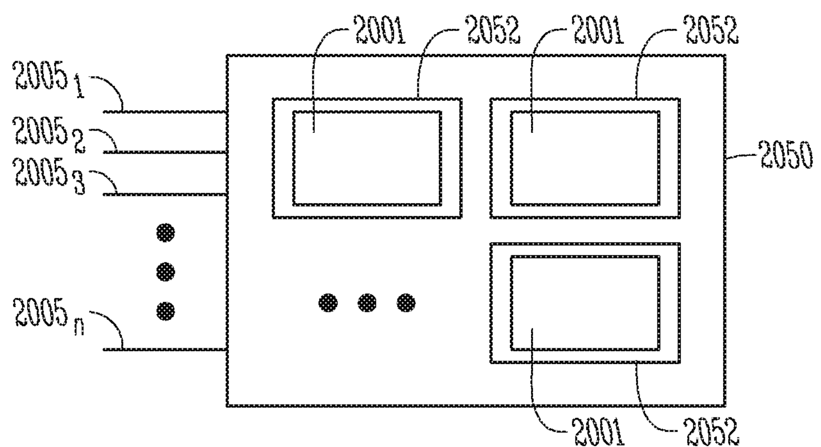
FIG. 20 is a view of a circuit module according to the teachings of the present invention.

As shown in FIG. 20, two or more substrate level packaged dice 2001 of the present invention may be combined, with or without protective casing, into a circuit module 2000 to enhance or extend the functionality of an individual die 2001. Circuit module 2000 may be a combination of dies 2001 representing a variety of functions, or a combination of dies 2001 containing the same functionality. In an embodiment, circuit module 2000 includes at least one socket, slot, recess or the like 2052 into which the die 2001 is received. One or more dies 2001 of circuit module 2000 include I/O structures in accordance with the invention and/or are fabricated in accordance with the present invention. In an embodiment, dies 2001 are inserted into a slot 2052 in a circuit board 2050 such that the package level terminals 202 or conductive traces 323 are in electrical communication with the contacts in the slot 2052. In an embodiment, package level terminals 202 or conductive traces 323 are in physical contact with contacts in the slot 2052. In an embodiment, the contacts package level terminals 202 or conductive traces 323 are press fit into the slot 2052 against the contacts of the slot.

Numeral 2052 in FIG. 20, in another embodiment, represents a mount including land patterns whereat the contacts according to the present invention are mounted. The mounting process includes an SMT process. For example, circuit module 2000 is a printed circuit board having land patterns on which solder paste is applied, e.g., by printing the solder paste. A substrate level packaged die 2001 of the present invention is picked and placed at the mount with the package level terminals 202 or conductive traces 323 aligned with the paste covered contacts of the mount. Either the package level terminals 202 or conductive traces 323 or the mount contacts are reflowed to create a physical and electrical connection.

Some examples of a circuit module include memory modules, device drivers, power modules, communication modems, processor modules and application-specific modules, and may include multilayer, multichip modules. Such modules will have a chip receiver in which a chip according to the present invention is insetted. Circuit module 2000 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 2000 will have a variety of leads $\mathbf{2005}_1$ through $\mathbf{2005}_N$ extending therefrom and coupled to the package level terminals 202 or conductive traces 323 of substrate level packaged dice 2001 providing unilateral or bilateral communication and control.

Figure 21:
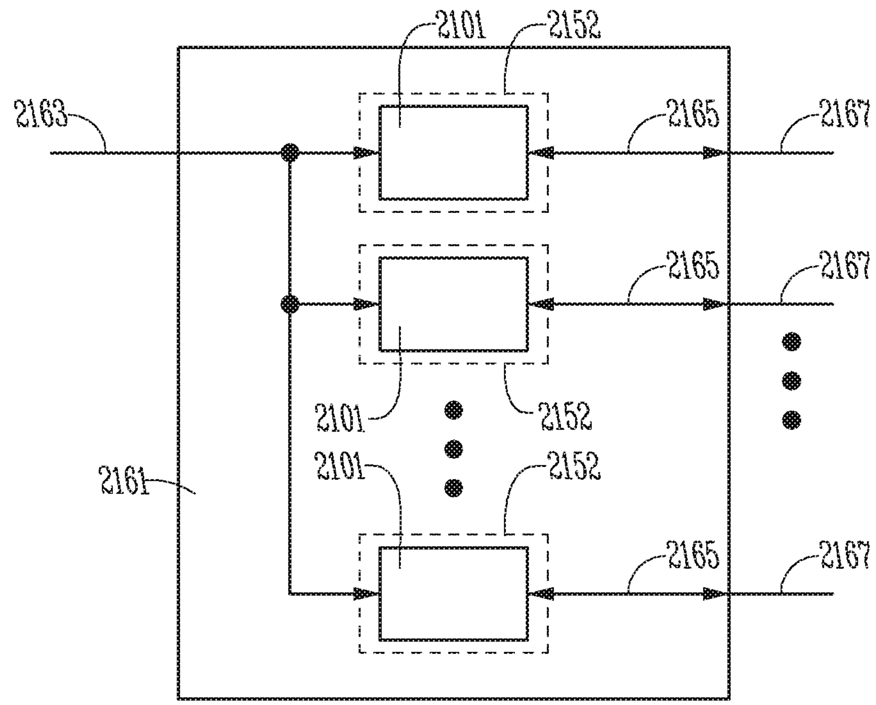
FIG. 21 is view of a memory module according to the teachings of the present invention.

FIG. 21 shows one embodiment of a circuit module as memory module 2100. Memory module 2100 contains multiple memory devices 2101 contained on support 2161. In an embodiment, support 2161 includes slots 2152 for receiving memory devices 2101 as described herein. The number of memory devices generally depends upon the desired bus width and the desire for parity. Memory devices 2101 include at least die in accordance with to the present invention. The support 2161 includes sockets, slots, recesses or the like 2152, each adapted to receive a memory device 2101 and provide electrical communication between a bus and memory device 2101. Memory module 2100 accepts a command signal from an external controller (not shown) on a command link 2163 and provides for data input and data output on data links 2165. The command link 2163 and data links 2165 are connected to leads 2167 extending from the support 2161. Leads 2167 are shown for conceptual purposes and are not limited to the positions shown in FIG. 21.

Electronic Systems

Figure 22:
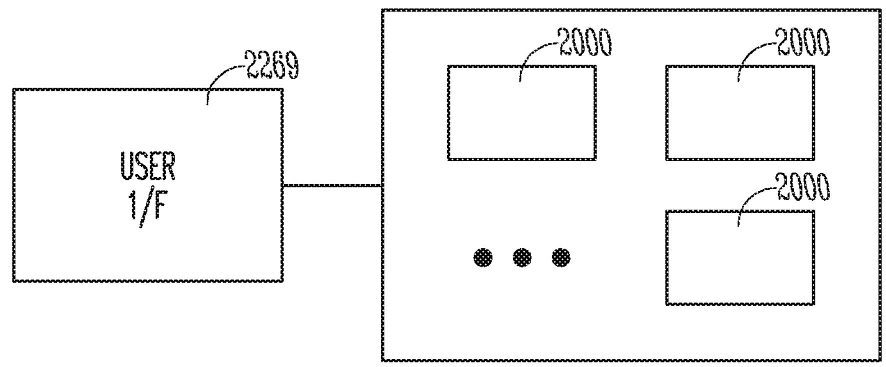
FIG. 22 is a view of an electronic system according to the teachings of the present invention.

FIG. 22 shows an embodiment of an electronic e 2200 containing one or more circuit modules 2000. At least one of the circuit modules 2000 contains a die in accordance with the present invention. Electronic system 2200 generally contains a user interface 2269. User interface 2269 provides a user of the electronic system 2200 with some form of control or observation of the results of the electronic system 2200. Some examples of user interface 2269 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 2269 may further describe access ports provided to electronic system 2200. Access ports are used to connect an electronic system to the more tangible user interface components previously exemplified. One or more of the circuit modules 2000 may be a processor providing some form of manipulation, control or direction of inputs from or outputs to user interface 2269, or of other information either preprogrammed into, or otherwise provided to, electronic system 2200. In an embodiment, electronic system 2200 includes memory modules 2100. As will be apparent from the lists of examples previously given, electronic system 2200 will often be associated with certain mechanical components (not shown) in addition to circuit modules 2000 and user interface 2269. It will be appreciated that the one or more circuit modules 2000 in electronic system 2200 can be replaced by a single integrated circuit. Furthermore, electronic system 2200 may be a subcomponent of a larger electronic system.

Figure 23:
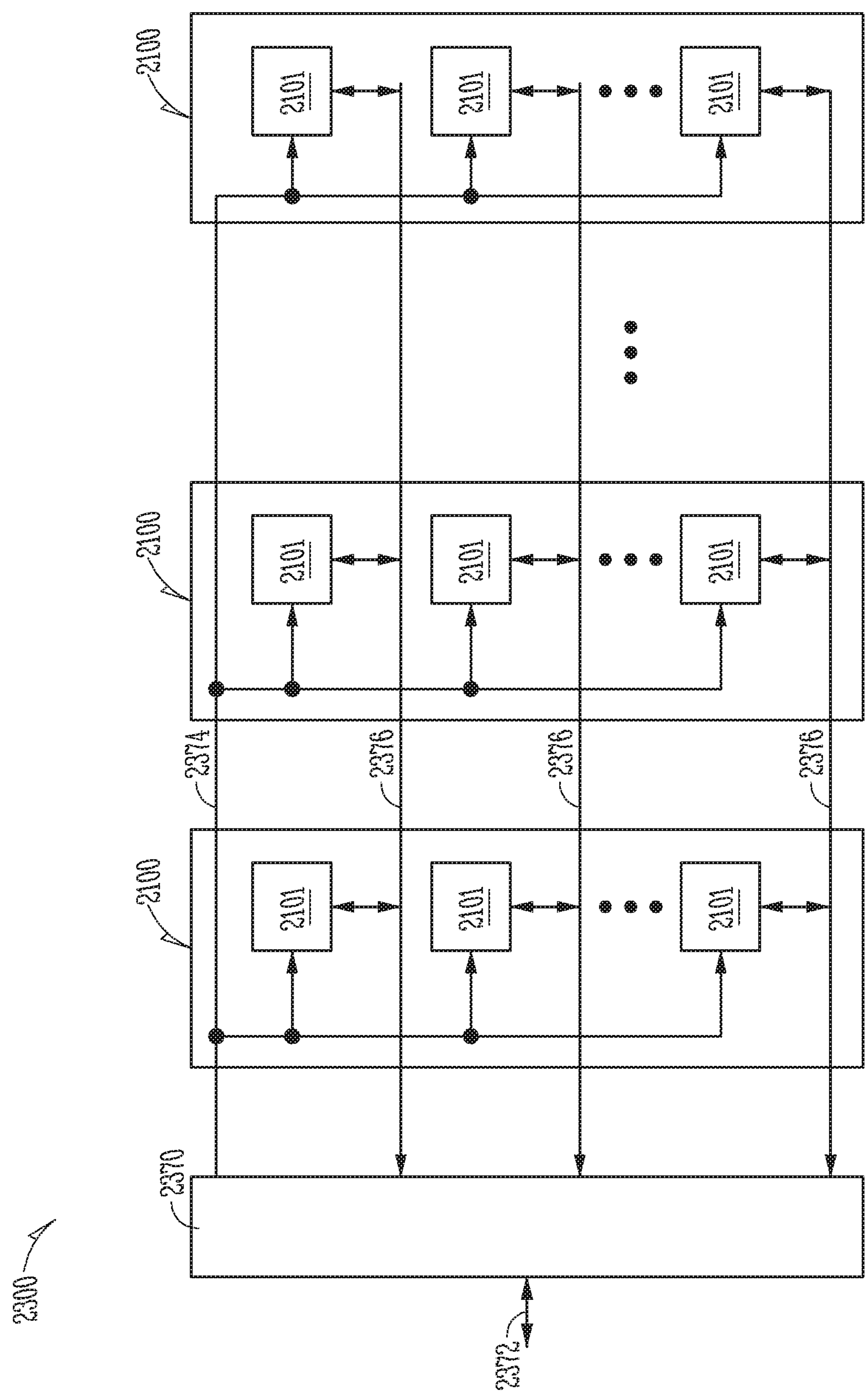
FIG. 23 is a view of an embodiment of an electronic system according to the teachings of the present invention.

FIG. 23 shows one embodiment of an electronic system as memory system 2300. Memory system 2300 contains one or more memory modules 2100 and a memory controller 2370. At least one of the memory modules 2100 includes a die in accordance with the present invention. Memory controller 2370 provides and controls a bidirectional interface between memory system 2300 and an external system bus 2372. Memory system 2300 accepts a command signal from the external bus 2372 and relays it to the one or more memory modules 2100 on a command link 2374. Memory system 2300 provides for data input and data output between the one or more memory modules 2100 and external system bus 2372 on data links 2376.

Figure 24:
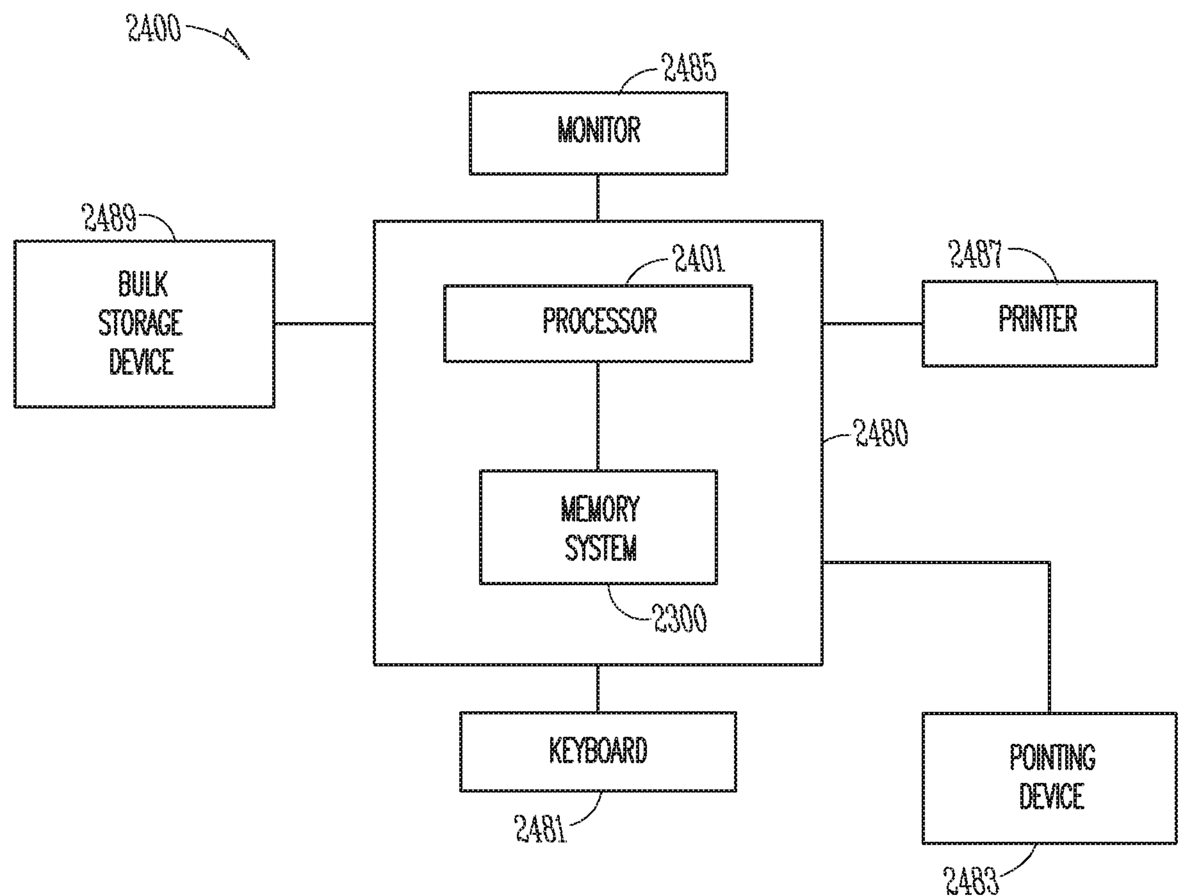
FIG. 24 is a view of a computer system according to the teachings of the present invention.

FIG. 24 shows a further embodiment of an electronic system as a computer system 2400. Computer system 2400 contains a processor 2401 and a memory system 2300 housed in a computer unit 2480. In an embodiment, the memory system 2300 includes a die in accordance with the present invention. In an embodiment, processor 2401 includes a die in accordance with the present invention. In an embodiment, the memory system and processor dies are combined according to the present invention. Computer system 2400 is but one example of an electronic system containing another electronic system, i.e., memory system 2300, as a subcomponent. Computer system 2400 optionally contains user interface components. Depicted in FIG. 11 are a keyboard 2481, a pointing device 2483 such as a mouse, trackball, or joystick, a monitor 2485, a printer 2487 and a bulk storage device 2489. It will be appreciated that other components are often associated with computer system 2400 such as modems, device driver cards, additional storage devices, etc. These other components, in an embodiment, include a die in accordance with the present invention. It will further be appreciated that the processor 2401 and memory system 2300 of computer system 2400 can be incorporated on a single integrated circuit. Such single package processing units reduce the communication time between the processor and the memory circuit.

CONCLUSION

It is desired to reduce the size of packaged components. This results in packaging material savings and increases throughput by reducing packaging fabrication times. Moreover, with the growing popularity of smaller electronic device the electronic components must be as small as possible. The present invention further provides methods for producing a packaged die. In an embodiment, dice are fixed on a base substrate that has contacts or terminals formed thereon. The dice are electrically connected to the terminals. For example, top level I/O pads of the dice are connected to the terminals by conductive traces running from the top of the dice along its side to the terminals below the dice. The backside of the base substrate is removed to expose the backside of the terminals thereby forming a true chip-size package. The die can now be singulated. This process can be performed at the wafer foundry thereby increasing fabrication throughput. Wafer foundries have fabrication and substrate handling equipment to facilitate the present process.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with the invention. For another example, other integrated circuit fabrication processes are adapted to produce the dies and chips according to the present invention. Accordingly, this application is intended to cover any adaptations or variations of the invention. It is manifestly intended that this invention be limited only by the following claims and equivalents thereof.

The invention claimed is:

1. A method of forming an integrated circuit (IC) package component, comprising:

fabricating a non-conductive base substrate having electrical conductors vertically extending from a top surface of the base substrate into the substrate and terminating within the base substrate, the top surface of the base substrate includes an interconnect area configured to receive an IC die;

fixing an IC die on the top surface of the base substrate, wherein the fixing includes applying adhesive to the top surface of the base substrate placing the IC die on the adhesive, and curing the adhesive to fix the IC die on the top surface of the base substrate; and removing at least a portion of a bottom surface of the base substrate to expose the electrical conductors such that the electrical conductors are exposed on both the top and bottom surfaces of the base substrate.

2. The method of claim 1, further comprising:

electrically connecting the IC die to the electrical conductors.

3. The method of claim 1, wherein removing the portion of the bottom surface of the base substrate is performed by an etching operation.

4. The method of claim 1, wherein removing the portion of the bottom surface of the base substrate includes etching the portion of the bottom surface of the base substrate.

5. The method of claim 1, wherein removing the portion of the bottom surface of the base substrate includes back-grinding the portion of the bottom surface of the base substrate.

6. The method of claim 1, wherein removing the portion of the bottom surface of the base substrate includes singulating the IC die from a remainder of the base substrate.

7. The method of claim 1, wherein removing the portion of the bottom surface of the base substrate includes etching the bottom surface of the base substrate.

8. The method of claim 1, wherein removing the portion of the bottom surface of the base substrate is performed by an abrasive removal operation.

9. The method of claim 1, wherein fabricating the non-conductive base substrate includes forming a metal trace from the IC die.

10. The method of claim 9, wherein forming the metal trace includes forming a copper trace.

11. The method of claim 9, wherein forming the metal trace includes forming an aluminum trace.

12. The method of claim 1, wherein fabricating the non-conductive base substrate includes forming a metal trace from a bond pad of the IC die.

13. The method of claim 1, wherein fabricating the non-conductive base substrate includes forming a metal trace from a first bond pad of the IC die to a second bond pad of another IC die through at least one of the electrical conductors.

* * * * *